US012575140B2

(12) United States Patent
    Xie et al.

(10) Patent No.:     US 12,575,140 B2
(45) Date of Patent:        Mar. 10, 2026

(54) DIFFUSION BREAK STRUCTURE FOR TRANSISTORS

(71) Applicant: International Business Machines Corporation, Armonk, NY (US)

(72) Inventors: Ruilong Xie, Niskayuna, NY (US); Tao Li, Slingerlands, NY (US); Julien Frougier, Albany, NY (US); Susan Ng Emans, Albany, NY (US); Carl Radens, LaGrangeville, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 501 days.

(21) Appl. No.: 18/080,892

(22) Filed: Dec. 14, 2022

(65) Prior Publication Data

US 2024/0204042 A1       Jun. 20, 2024

(51) Int. Cl.
    *H10D 62/10*         (2025.01)
    *H10D 30/62*         (2025.01)
    *H10D 62/13*         (2025.01)
    *H10D 84/85*         (2025.01)

(52) U.S. Cl.
    CPC ........... *H10D 62/113* (2025.01); *H10D 30/62* (2025.01); *H10D 62/151* (2025.01); *H10D 84/853* (2025.01)

(58) Field of Classification Search
    CPC .... H10D 62/113; H10D 30/62; H10D 84/853; H10D 62/151
    See application file for complete search history.

(56)                 References Cited

U.S. PATENT DOCUMENTS

| | | | |
|---|---|---|---|
| 8,878,309 B1 | 11/2014 | Hong et al. | |
| 9,412,616 B1 | 8/2016 | Xie et al. | |
| 10,373,942 B2 | 8/2019 | Asra et al. | |
| 10,522,679 B2 | 12/2019 | Jha et al. | |
| 10,990,740 B2 | 4/2021 | Kim et al. | |
| 11,101,267 B2 | 8/2021 | Lim et al. | |
| 2017/0141211 A1* | 5/2017 | Xie ........................ | H10D 30/62 |
| 2018/0114792 A1 | 4/2018 | Basker et al. | |
| 2018/0261596 A1* | 9/2018 | Jun .................... | H10D 30/6219 |
| 2019/0198491 A1 | 6/2019 | Do et al. | |
| 2021/0408231 A1* | 12/2021 | Huang .................. | H01L 23/485 |
| 2022/0085018 A1 | 3/2022 | Sherlekar et al. | |
| 2022/0392797 A1* | 12/2022 | Yu ...................... | H10D 84/0151 |
| 2023/0231026 A1* | 7/2023 | Kim .................. | H10D 84/0149 |
| | | | 257/288 |

FOREIGN PATENT DOCUMENTS

| | | | | |
|---|---|---|---|---|
| CN | 107818943 B | * | 3/2019 | ........... H10D 84/834 |

* cited by examiner

*Primary Examiner* — Ratisha Mehta
*Assistant Examiner* — Timothy Edward Duren
(74) *Attorney, Agent, or Firm* — Kimberly Zillig; Ryan, Mason & Lewis, LLP

(57)                 ABSTRACT

A semiconductor device includes a first gate region and a second gate region. A diffusion break region is between the first gate region and the second gate region. A top surface of the diffusion break region is co-planar with at least one of a top surface of one or more gate contacts and a top surface of one or more source/drain contacts.

20 Claims, 7 Drawing Sheets

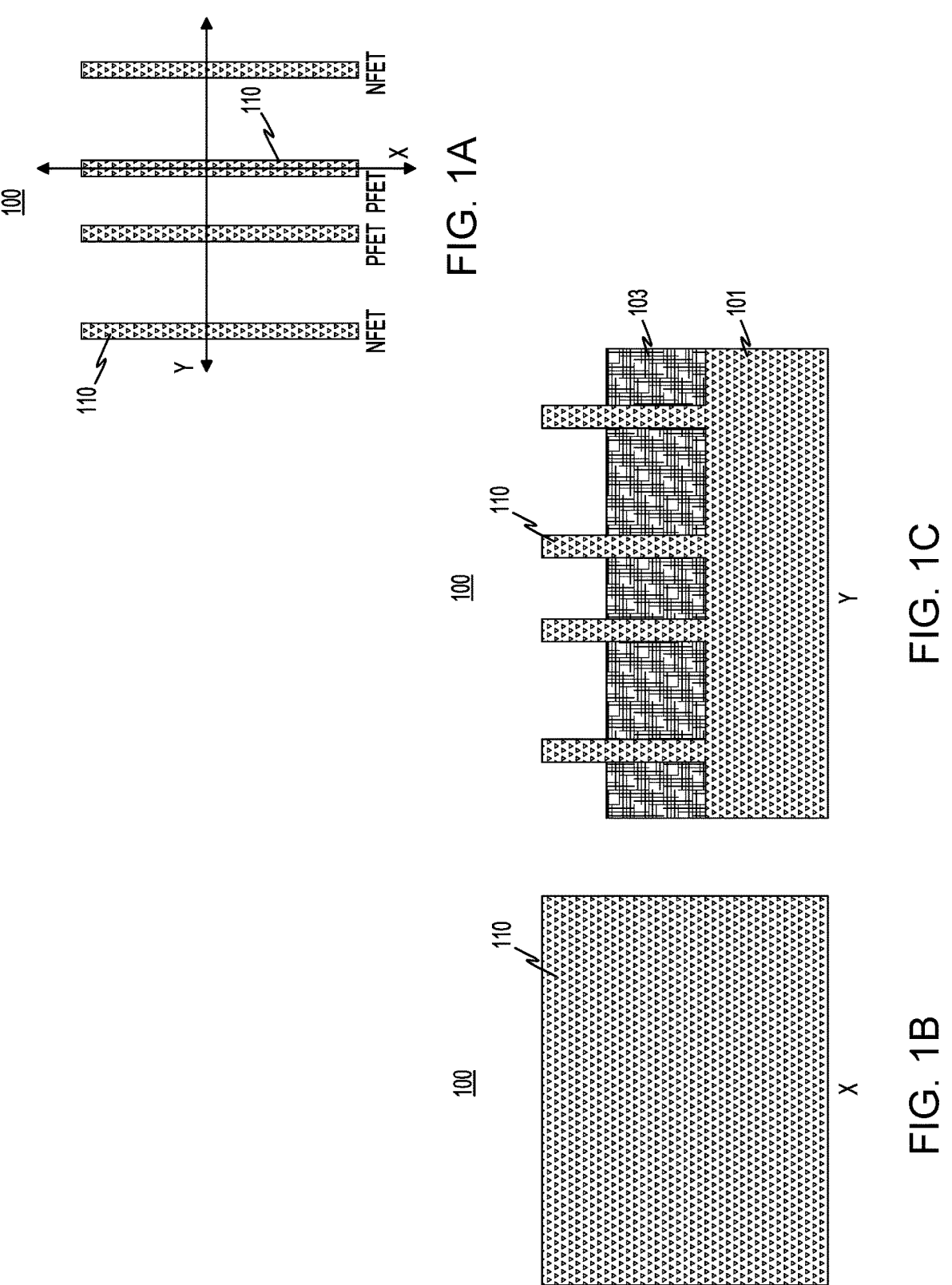

DIFFUSION BREAK STRUCTURE FOR TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming a diffusion break structure for a semiconductor device.

In one embodiment, a semiconductor device includes a first gate region and a second gate region. A diffusion break region is between the first gate region and the second gate region. A top surface of the diffusion break region is co-planar with at least one of a top surface of one or more gate contacts and a top surface of one or more source/drain contacts.

In another embodiment, a semiconductor device includes a first gate region and a second gate region. A double diffusion break region is between the first gate region and the second gate region. A top surface of the double diffusion break region is above a top surface of the first gate region and above a top surface of the second gate region.

In another embodiment, a semiconductor device includes a first gate contact, a second gate contact, a first source/drain contact, and a second source/drain contact. The diffusion break region is between the first gate contact and the second gate contact, and between the first source/drain contact and the second source/drain contact. A top surface of the diffusion break region is co-planar with at least one of top surfaces of the first and second gate contacts and top surfaces of the first and second source/drain contacts.

These and other features and advantages of embodiments described herein will become more apparent from the accompanying drawings and the following detailed description.

BRIEF DESCRIPTION OF THE DRAWINGS

FIG. 1A is a schematic top view of a semiconductor structure including a plurality of fins, according to an embodiment of the invention.

FIG. 1B is a schematic cross-sectional view taken along a first axis in FIG. 1A and illustrating a fin of the plurality of fins, according to an embodiment of the invention.

FIG. 1C is a schematic cross-sectional view taken along a second axis in FIG. 1A and illustrating the semiconductor structure including the plurality of fins, according to an embodiment of the invention.

DETAILED DESCRIPTION

Figures 2A, 2B, 2C:
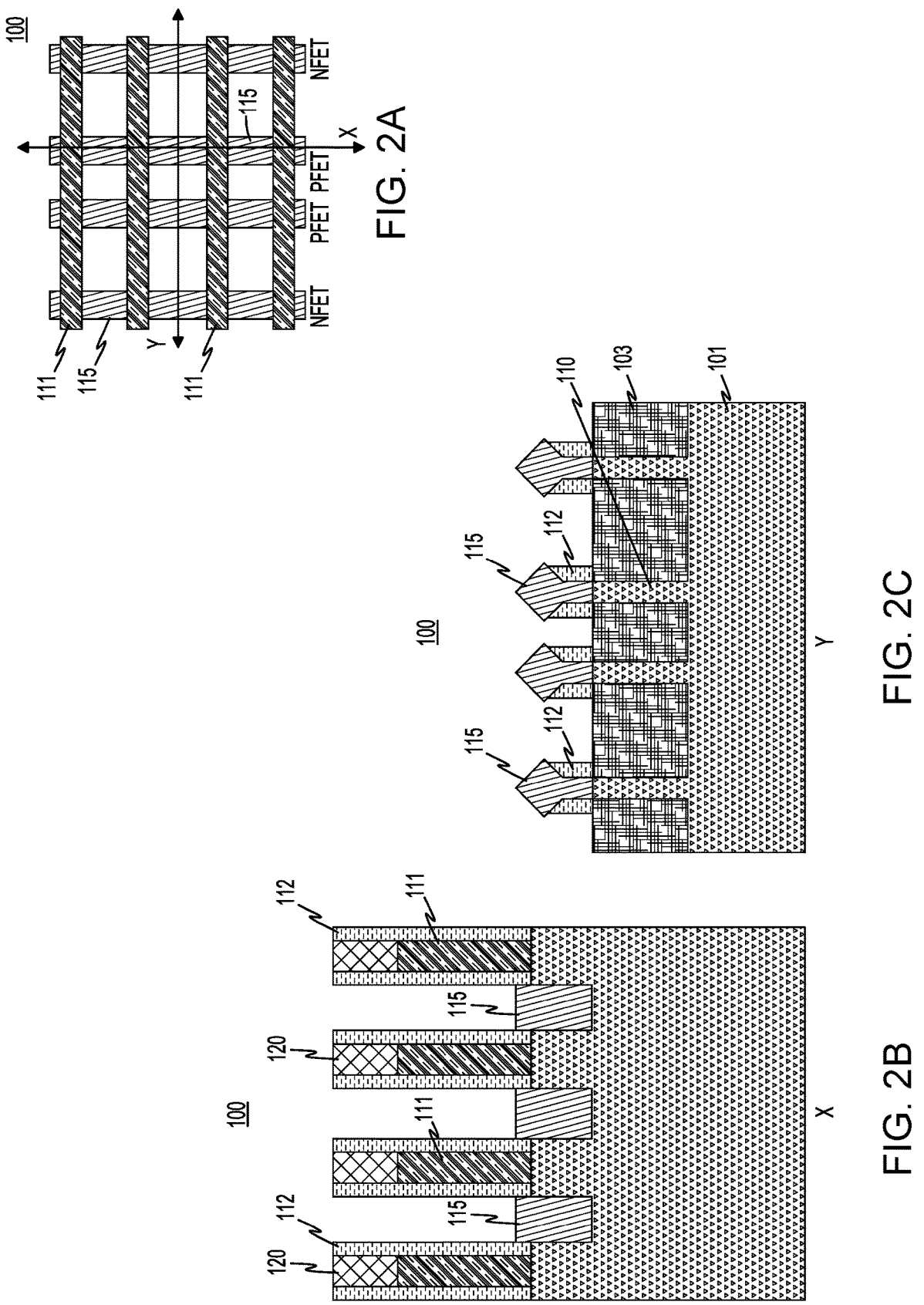
FIG. 2A is a schematic top view illustrating formation of source/drain regions and sacrificial gate regions on the semiconductor structure, according to an embodiment of the invention.
FIG. 2B is a schematic cross-sectional view taken along the first axis in FIG. 2A and illustrating formation of the source/drain regions and sacrificial gate regions on the semiconductor structure, according to an embodiment of the invention.
FIG. 2C is a schematic cross-sectional view taken along the second axis in FIG. 2A and illustrating formation of the source/drain regions on the semiconductor structure, according to an embodiment of the invention.

Illustrative embodiments of the invention may be described herein in the context of illustrative methods for forming a diffusion break structure for a semiconductor device where the diffusion break structure has a top surface that is co-planar with top surfaces of one or more middle-of-line (MOL) contacts, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers may be used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be twodimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation complementary FET (CFET) devices may be used. CFET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. CFET structures provide improved track height scaling, leading to structural gains (e.g., such as 30-40% structural gains for different types of devices, such as logic devices, static random-access memory (SRAM) devices, etc.). In CFET structures, n-type and p-type nanowires or nanosheets are stacked on each other, eliminating n-to-p separation bottlenecks and reducing the device area footprint. There is, however, a continued to desire for further scaling and reducing the size of FETs.

As discussed above, various techniques may be used to reduce the size of FETs, including through the use of fin-shaped channels in FinFET devices, through the use of stacked nanosheet channels formed over a semiconductor substrate, and next-generation CFET devices.

Referring to FIGS. 1A-1C, a semiconductor structure 100 comprises a semiconductor substrate 101 including semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 110, can be formed by patterning a semiconductor layer into the fins 110. The semiconductor layer can include, but is not necessarily limited to, Si, SiGe or III-V materials, and may be epitaxially grown. According to an embodiment, a hardmask (not shown) including, for example, a dielectric material, such as silicon nitride (SiN) is formed on portions of the semiconductor layer that are to be formed into the fins 110. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. In addition, although four fins 110 are shown in the figures for ease of explanation, more or less than four fins can be formed.

As shown in FIG. 1C, a dielectric layer 103 including, but not necessarily limited to silicon oxide ($SiO_x$), where x is, for example, 2 in the case of silicon dioxide ($SiO_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed on the semiconductor substrate 101 and around the fins 110. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, The dielectric layer 103 defines one or more isolation regions, such as, for example, shallow trench isolation (STI) regions. As can be seen in FIG. 1A, some of the fins 110 correspond to n-type and p-type transistor regions (NFET and PFET).

Referring to FIGS. 2A-2C, sacrificial gate portions 111 are formed on and around the fins 110. The sacrificial gate portions 111 include, but are not necessarily limited to, amorphous silicon (a-Si). The sacrificial gate portions 111 are deposited using deposition techniques such as, for example, CVD, PECVD, RFCVD, PVD, ALD, MBD, PLD, LSMCD, sputtering and/or plating, followed by a planarization process, such as, chemical mechanical planarization (CMP), and lithography and etching steps to remove excess sacrificial gate material, and pattern the deposited layer.

Gate spacers 112 are positioned on opposite lateral sides of the sacrificial gate portions 111 and the fins 110. The gate spacers 112 are formed from a dielectric material including, but not necessarily limited to, a nitride, such as, silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN) or other dielectric. The gate spacers 112 can be formed by any suitable techniques such as deposition followed by directional etching. Deposition may include, but is not limited to, ALD or CVD. Directional etching may include but is not limited to RIE. Hardmasks 120 comprising, for example, SiN, $SiO_2$, or combination of SiN and $SiO_2$, are formed on the sacrificial gate portions 111.

In an illustrative embodiment, fins 110 where source/drain regions 115 are to be formed are exposed and recessed. Source/drain regions 115 are formed in the PFET and NFET regions, respectively. The source/drain regions 115 are epitaxially grown in epitaxial growth processes from the upper portions of the recessed fins 110.

According to a non-limiting embodiment of the present invention, the conditions of the epitaxial growth process for the source/drain regions 115 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure ranges of about 450° ° C. to about 800° C., and about 5 Torr-about 300 Torr.

The source/drain regions 115 may be suitably doped, such as by using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (TI).

In non-limiting illustrative embodiments, the source/drain regions 115 can comprise in-situ phosphorous doped (ISPD) silicon or Si:C for n-type devices, or in-situ boron doped (ISBD) silicon germanium for p-type devices, at concentrations of about $1\times10^{19}/cm^3$ to about $3\times10^{21}/cm^3$. By "in-situ," it is meant that the dopant that dictates the conductivity type of the doped layer is introduced during the process step, e.g., epitaxial deposition, which forms the doped layer.

Figures 3A, 3B, 3C:
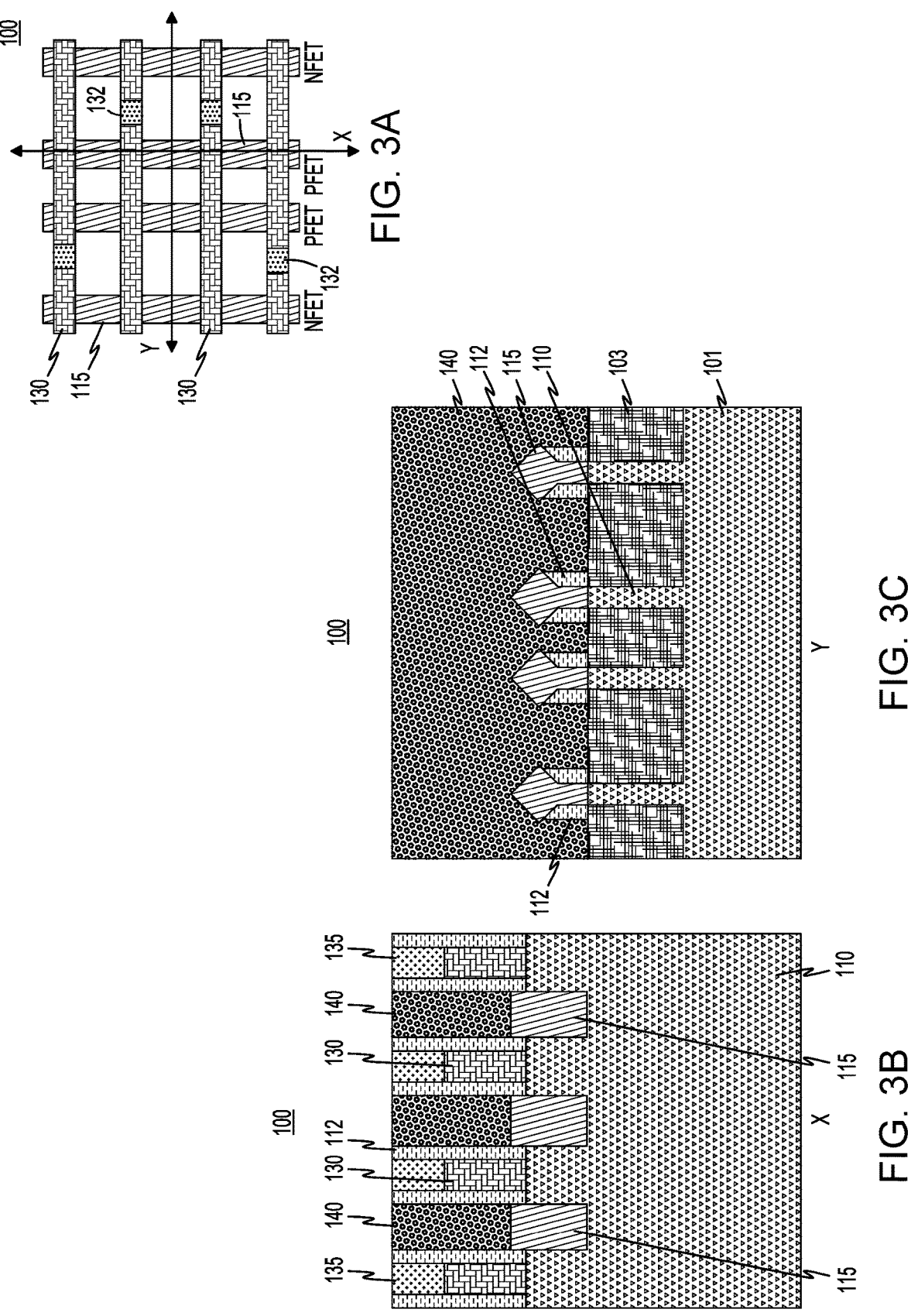
FIG. 3A is a schematic top view illustrating formation of replacement gate regions and gate cut portions on the semiconductor structure, according to an embodiment of the invention.
FIG. 3B is a schematic cross-sectional view taken along the first axis in FIG. 3A and illustrating formation of the replacement gate regions and inter-layer dielectric (ILD) layer formation on the semiconductor structure, according to an embodiment of the invention.
FIG. 3C is a schematic cross-sectional view taken along the second axis in FIG. 3A and illustrating formation of the ILD layer on the semiconductor structure, according to an embodiment of the invention.

Referring to FIGS. 3A-3C, an inter-layer dielectric (ILD) layer 140 is deposited to fill in portions on and around the source/drain regions 115 and the sacrificial gate portions 111, which are eventually replaced by gate portions 130 as shown in FIGS. 3A and 3B. The ILD layer 140 is deposited using deposition techniques such as, for example, CVD, PECVD, RFCVD, PVD, ALD, MBD, PLD, and/or LSMCD, followed by a planarization process, such as, CMP to remove excess portions of the ILD layer 140 deposited on top of the sacrificial gate portions 111 and gate spacers 112. The ILD layer 140 may comprise, for example, $SiO_x$, SiOC, SiOCN or some other dielectric material.

Parts of the sacrificial gate portions 111 are removed to form trenches in which dielectric material is deposited to form gate cut portions 132, which eventually isolate gate portions 130 as shown in FIG. 3A. The parts of the sacrificial gate portions 111 are etched using, for example, RIE. The dielectric material of the gate cut portions 132 is deposited using deposition techniques such as, for example, CVD, PECVD, RFCVD, PVD, ALD, MBD, PLD, and/or LSMCD, followed by a planarization process, such as, CMP to remove excess portions of the dielectric material deposited on top of the sacrificial gate portions 111. The dielectric material of the gate cut portions 132 may comprise, for example, $SiO_x$, SiN or some other dielectric.

The hardmasks 120 and sacrificial gate portions 111 are selectively removed to create vacant areas where gate portions 130 and self-aligned contact (SAC) cap layers 135 will be formed in place of the sacrificial gate portions 111. The selective removal can be performed using, for example hot ammonia to remove sacrificial gate portions 111. In illustrative embodiments, each gate portion 130 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate portions 130 each include a metal gate portion including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The metal gate portions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. It should be appreciated that various other materials may be used for the metal gate portions as desired. The SAC cap layers 135 comprise, but are not necessarily limited to, silicon SiN, SiBN, SiBCN or SiOCN. According to an embodiment of the present invention, the SAC cap layers 135 are deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Figures 4A, 4B, 4C:
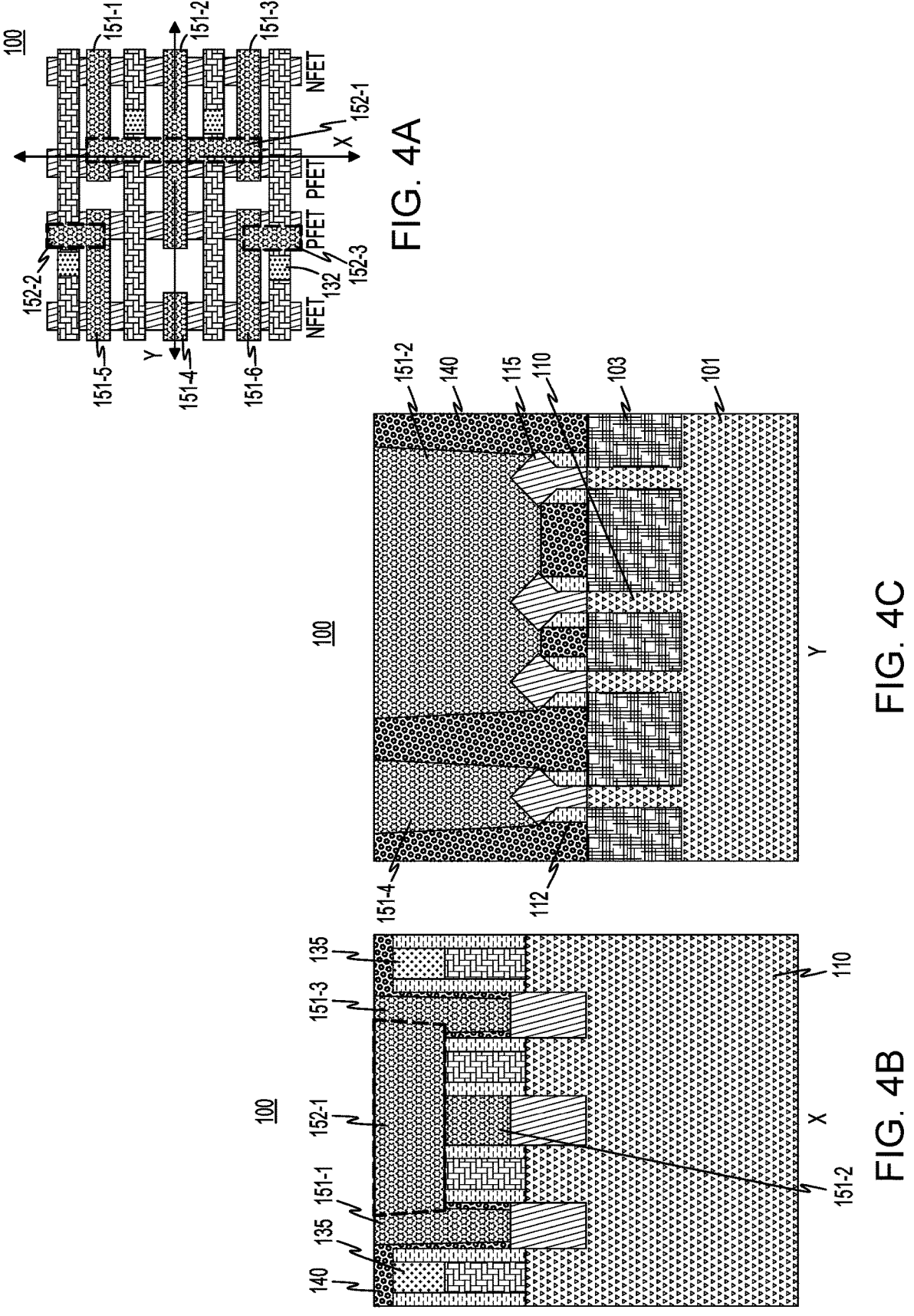
FIG. 4A is a schematic top view illustrating contact formation on the semiconductor structure, according to an embodiment of the invention.
FIG. 4B is a schematic cross-sectional view taken along the first axis in FIG. 4A and illustrating contact formation on the semiconductor structure, according to an embodiment of the invention.
FIG. 4C is a schematic cross-sectional view taken along the second axis in FIG. 4A and illustrating contact formation on the semiconductor structure, according to an embodiment of the invention.

Referring to FIGS. 4A-4C, source/drain contacts 151-1, 151-2, 151-3, 151-4, 151-5 and 151-6 (collectively "source/drain contacts 151") and gate contacts 152-1, 152-2 and 152-3 (collectively "gate contacts 152") are formed. In more detail, portions of the semiconductor structure 100 are masked (e.g., with a hardmask (not shown)). At unmasked portions corresponding to where the source/drain contacts 151 and gate contacts 152 are to be formed, openings (e.g., contact trenches) are formed by removing parts of the ILD layer 140 and some of the SAC cap layers 135 over the source/drain regions 115 and gate portions 130. The contact trenches are formed using, for example, a dry etching process using a RIE or ion beam etch (IBE) process, a wet chemical etch process or a combination of these etching processes. The contact trenches expose corresponding source/drain regions 115 and gate portions 130.

The source/drain contacts 151 and gate contacts 152 are formed in the contact trenches. Prior to the addition of a diffusion break region 175 discussed herein in connection with FIGS. 7A-7C, the gate contact 152-1 is formed on and contacts two gate portions 130 and three source/drain contacts 151-1, 151-2 and 151-3. The source/drain contacts 151-1, 151-3, 151-5 and 151-6 each contact and are each formed on two source/drain regions 115. The source/drain contact 151-2 is formed and contacts three source/drain regions 115, and the source/drain contact 151-4 is formed and contacts one source/drain region 115.

The source/drain contacts 151 and gate contacts 152 each comprise, for example, a silicide liner such as Ti, Ni, NiPt, an adhesion metal liner, such as TiN, and a low resistance conductor such as, but not necessarily limited to tungsten, cobalt, ruthenium, etc., and can be deposited using, for example, a deposition technique such as CVD, PECVD, RFCVD, PVD, ALD, MBD, PLD, LSMCD, sputtering and/or plating. The source/drain contacts 151 and gate contacts 152 may be referred to herein as Middle-of-Line (MOL) contacts.

Figures 5A, 5B, 5C:
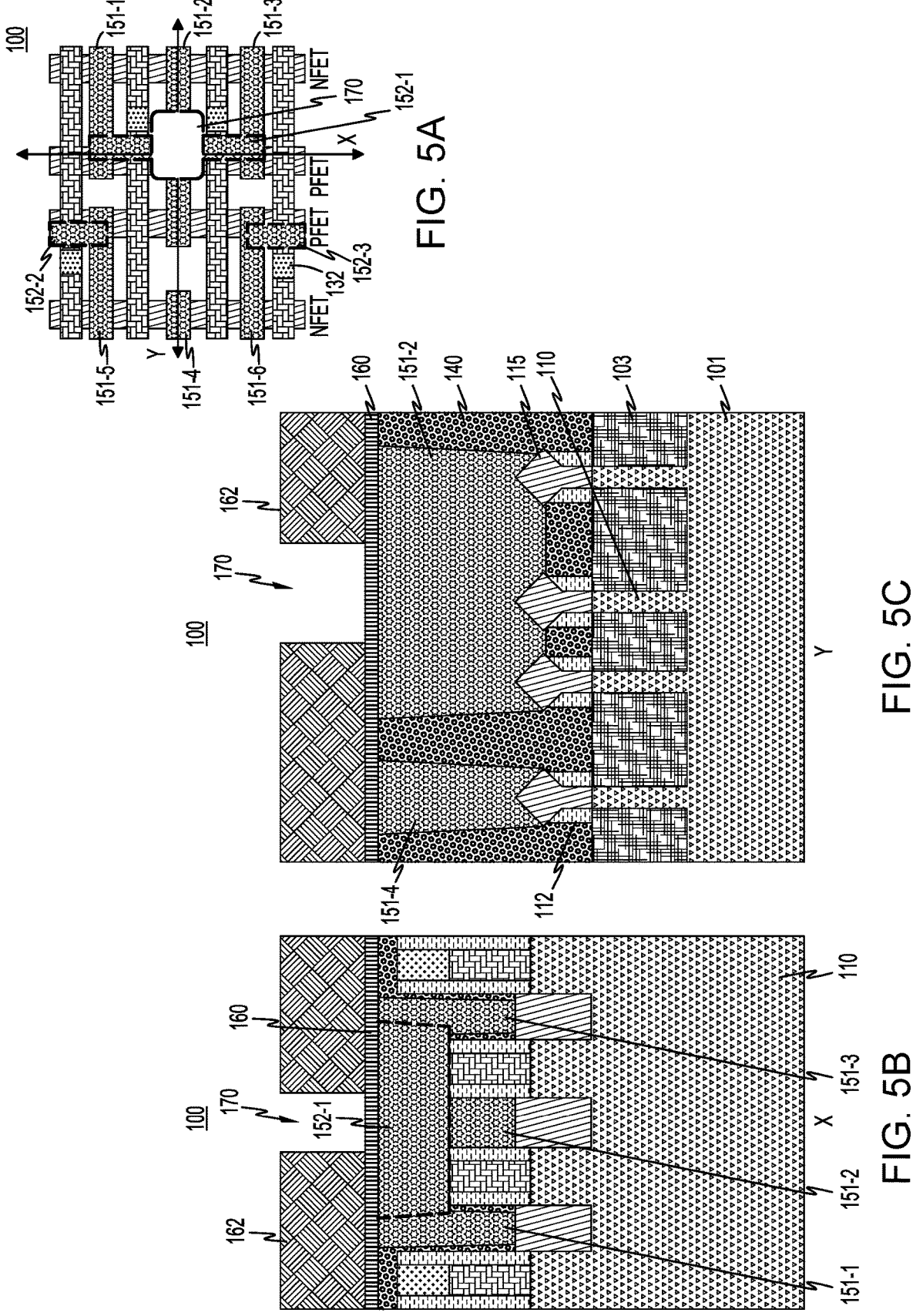
FIG. 5A is a schematic top view illustrating hardmask layer and organic planarization layer (OPL) formation on the semiconductor structure, according to an embodiment of the invention.
FIG. 5B is a schematic cross-sectional view taken along the first axis in FIG. 5A and illustrating hardmask layer and OPL formation on the semiconductor structure, according to an embodiment of the invention.
FIG. 5C is a schematic cross-sectional view taken along the second axis in FIG. 5A and illustrating hardmask layer and OPL formation on the semiconductor structure, according to an embodiment of the invention.

Referring to FIGS. 5A-5C, a hardmask layer 160 and OPL 162 are formed on the semiconductor structure 100 of FIGS. 4A-4C. The hardmask layer 160 can be formed by one or more of the deposition techniques such as, for example, CVD, PECVD, RFCVD, PVD, ALD, MBD, PLD, and/or LSMCD. The hardmask material can comprise for example, one or more dielectrics, including, but not necessarily limited to, SiN, SiC, SiON, SiOC, SiCN, BN, SiBN, SiBCN, SiOCN, $SiO_x$ and/or combinations thereof. The OPL 162 is formed on the hardmask layer 160. The OPL 162 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 162 can be deposited, for example, by spin coating, to a thickness of about 100 nm-about 200 nm. An opening 170 is formed in the OPL 162 corresponding to where the diffusion break region 175 is to be formed.

Figures 6A, 6B, 6C:
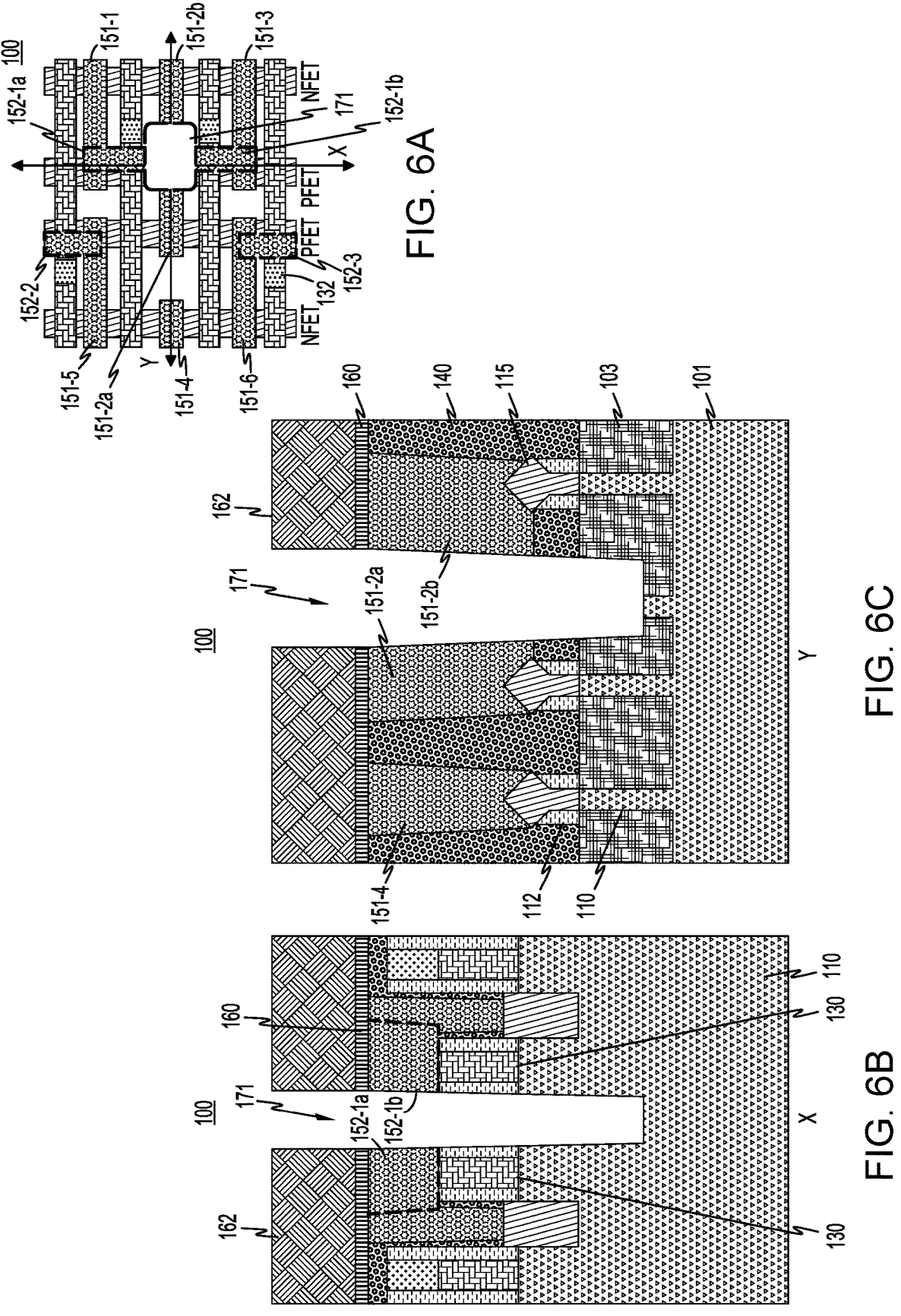
FIG. 6A is a schematic top view illustrating formation of a trench in the semiconductor structure for a double diffusion break, according to an embodiment of the invention.
FIG. 6B is a schematic cross-sectional view taken along the first axis in FIG. 6A and illustrating formation of the trench in the semiconductor structure for the double diffusion break, according to an embodiment of the invention.
FIG. 6C is a schematic cross-sectional view taken along the second axis in FIG. 6A and illustrating formation of the trench in the semiconductor structure for the double diffusion break, according to an embodiment of the invention.

Referring to FIGS. 6A-6B, an etching process such as, for example, RIE, is performed via the opening 170 in the OPL 162 to form opening 171 (e.g., a trench) where the diffusion break region 175 will be formed. The opening is formed by etching through the hardmask layer 160, part of source/drain contact 151-2, part of gate contact 152-1, part of dielectric layer 103 (e.g., part of an STI region) and part of a fin 110. The opening 171 extends from a top of the semiconductor structure 100 down into the dielectric layer 103 near a bottom portion of a fin 110. The opening 171 divides source/drain contact 151-2 into a first source/drain contact part 151-2a and a second source/drain contact part 151-2b, which will be isolated from each other by the diffusion break region 175. The opening 171 divides gate contact 152-1 into a first gate contact part 152-1a and a second gate contact part 152-1b, which will be isolated from each other by the diffusion break region 175.

The opening 171 decreases in width in a direction toward the semiconductor substrate 101. Sides of the opening 171 abut sides of first and second source/drain contact parts 151-2a and 151-2b so that the first and second source/drain contact parts 151-2a and 151-2b increase in width in a direction toward the semiconductor substrate 101. Similarly, sides of the opening 171 abut sides of first and second gate contact parts 152-1a and 152-1b so that the first and second gate contact parts 152-1a and 152-1b increase in width in a direction toward the semiconductor substrate 101. Sides of the opening 171 also abut sides of the ILD layer 140 and dielectric layer 103 under the first and second source/drain contact parts 151-2a and 151-2b. Sides of the opening 171 also abut sides of respective gate spacers 112 adjacent the two gate portions 130 under the first and second gate contact parts 152-1a and 152-1b. The opening 171 extends below the bottom surfaces of the first and second source/drain contact parts 151-2a and 151-2b, and the bottom surfaces of the first and second gate contact parts 152-1a and 152-1b.

Figures 7A, 7B, 7C:
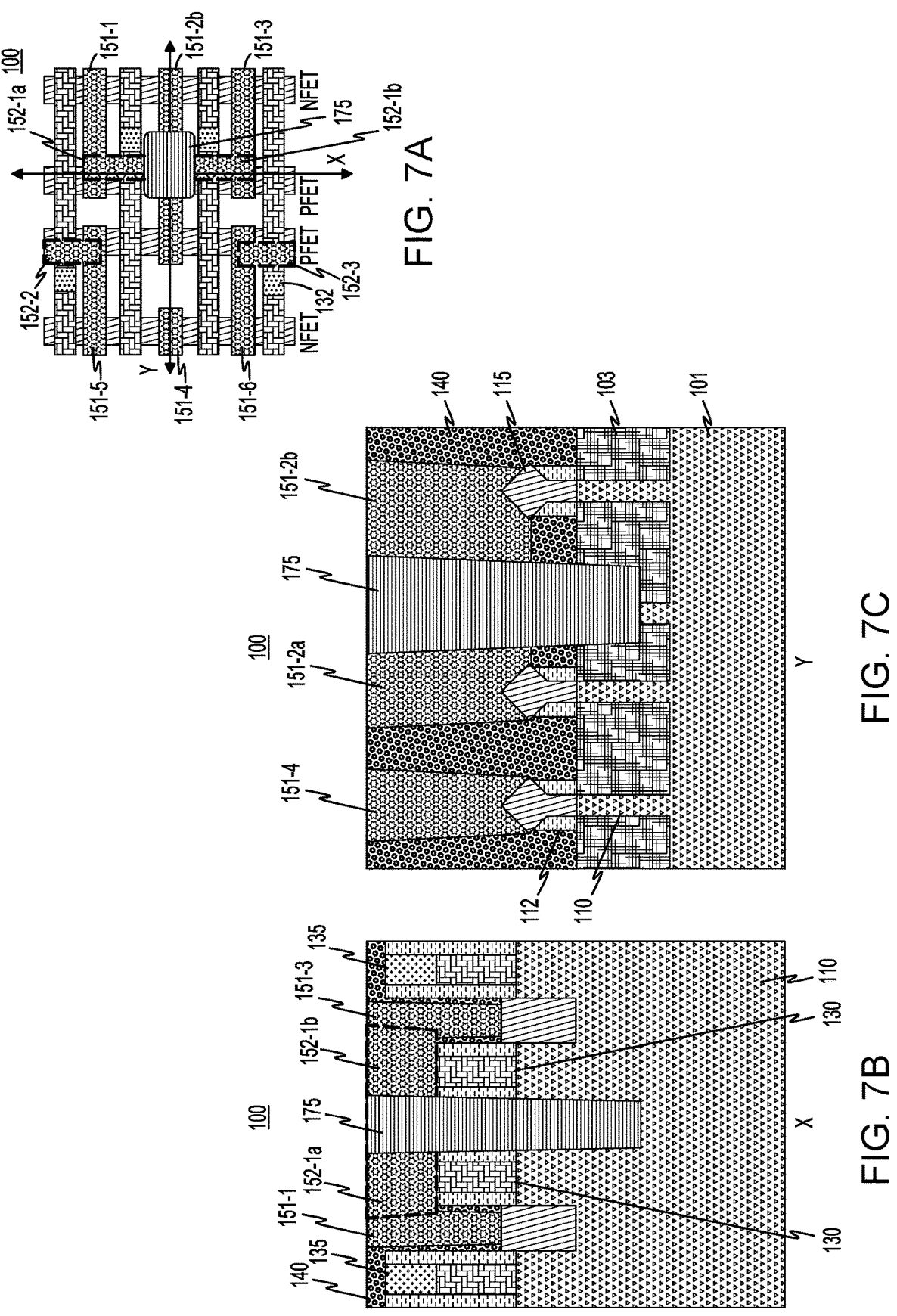
FIG. 7A is a schematic top view illustrating dielectric layer deposition to form the double diffusion break, according to an embodiment of the invention.
FIG. 7B is a schematic cross-sectional view taken along the first axis in FIG. 7A and illustrating hardmask layer and OPL removal from the semiconductor structure and dielectric layer deposition to form the double diffusion break, according to an embodiment of the invention.
FIG. 7C is a schematic cross-sectional view taken along the second axis in FIG. 7A and illustrating hardmask layer and OPL removal from the semiconductor structure and dielectric layer deposition to form the double diffusion break, according to an embodiment of the invention.

Referring to FIGS. 7A-7B, the OPL 162 is removed, and the opening 171 is filled with dielectric material to form the diffusion break region 175. The OPL 162 is stripped using, for example, oxygen plasma, nitrogen/hydrogen plasma or other carbon strip process. OPL stripping causes minimal or no damage to exposed layers. Dielectric material such as, for example, $SiO_2$, SiN, SiOC, SiOCN, SiBCN, SiC, or combination of those materials, is deposited in the opening 171 using deposition techniques such as, for example, CVD, PECVD, RFCVD, PVD, ALD, MBD, PLD, and/or LSMCD, followed by a planarization process, such as, CMP. The CMP process removes excess portions of the dielectric material deposited on top of the hardmask layer 160, and removes the hardmask layer 160. As can be seen in FIGS. 7B and 7C, the top surface of the diffusion break region 175 is co-planar with top surfaces of at least the source/drain contacts 151-1, 151-3 and 151-4, and with the top surfaces of the first and second source/drain contact parts 151-2a and 151-2b. The top surface of the diffusion break region 175 is also co-planar with top surfaces of at least the first and second gate contact parts 152-1a and 152-1b. The first and second source/drain contact parts 151-2a and 151-2b may each be referred to herein as a source/drain contact and the first and second gate contact parts 152-1a and 152-1b may each be referred to herein as a gate contact.

Like the opening 171, the diffusion break region 175 extends from a top of the semiconductor structure 100 down into the dielectric layer 103 near a bottom portion of a fin 110. The diffusion break region 175 divides source/drain contact 151-2 into a first source/drain contact part 151-2a and a second source/drain contact part 151-2b, which are isolated from each other by the diffusion break region 175. The diffusion break region 175 divides gate contact 152-1 into a first gate contact part 152-1a and a second gate contact part 152-1b, which are isolated from each other by the diffusion break region 175.

Like the opening 171, the diffusion break region 175 decreases in width in a direction toward the semiconductor substrate 101. Sides (also referred to herein as "edges") of the diffusion break region 175 abut sides of first and second source/drain contact parts 151-2a and 151-2b so that the first and second source/drain contact parts 151-2a and 151-2b increase in width in a direction toward the semiconductor substrate 101. Similarly, sides of the diffusion break region 175 abut sides of first and second gate contact parts 152-1a and 152-1b so that the first and second gate contact parts 152-1a and 152-1b increase in width in a direction toward the semiconductor substrate 101. Sides of the diffusion break region 175 also abut sides of the ILD layer 140 and dielectric layer 103 under the first and second source/drain contact parts 151-2a and 151-2b. Sides of the diffusion break region 175 also abut sides of respective gate spacers 112 adjacent the two gate portions 130 under the first and second gate contact parts 152-1a and 152-1b. The diffusion break region 175 extends below the bottom surfaces of the first and second source/drain contact parts 151-2a and 151-2b, and the bottom surfaces of the first and second gate contact parts 152-1a and 152-1b.

As can be seen, the diffusion break region 175 is disposed between two gate portions 130. The diffusion break region 175 is disposed between the first and second gate contact parts 152-1a and 152-1b to isolate the first and second gate contact parts 152-1a and 152-1b from each other so that they are separate gate contacts. The first and second gate contact parts 152-1a and 152-1b are cross-coupled with source/drain contact 151-1 and source/drain contact 151-3, respectively. In an illustrative embodiment, the diffusion break region 175 is disposed between the cross-coupled first and second gate contact parts 152-1a and 152-1b in an SRAM device.

As can be seen, the diffusion break region 175 is disposed between two source/drain regions 115. The diffusion break region 175 is disposed between the first and second source/drain contact parts 151-2a and 151-2b to isolate the first and second source/drain contact parts 151-2a and 151-2b from each other so that they are separate source/drain contacts. In an illustrative embodiment, the first source/drain contact part 151-2a corresponds to a supply voltage (Vdd) and the second source/drain contact part 151-2b corresponds to a bitline voltage for an SRAM.

A bottom surface of the diffusion break region 175 is under bottom surfaces of the gate contacts 152 and source/drain contacts 151. The diffusion break region 175 comprises, for example, a double diffusion break region. In general, a double diffusion break region has a lateral width in a gate length direction of a FinFET greater than the lateral width of a single gate structure, while a single diffusion break region has a lateral width in a gate length direction of a FinFET less than the lateral width of a single gate structure. Alternatively, the diffusion break region 175 comprises a single diffusion break region.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. An example integrated circuit includes one or more semiconductor devices with the above-described diffusion break structure.

As noted above, illustrative embodiments correspond to methods for forming a diffusion break structure for a semiconductor device where the diffusion break structure has a top surface that is co-planar with top surfaces of one or more MOL contacts, along with illustrative apparatus, systems and devices formed using such methods. The diffusion break region between two cross-coupled gate contacts allows for strong cross-coupling without the gate contact to source/drain contact short concerns of conventional structures. As a result, increased transistor control can be achieved while maintaining the same or smaller footprints.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a first gate region;
a second gate region;
a first gate contact on the first gate region;
a second gate contact on the second gate region; and
a diffusion break region between the first gate region and the second gate region, a first edge of the diffusion break region abutting an edge of the first gate contact and a second edge of the diffusion break region abutting an edge of the second gate contact;
wherein a top surface of the diffusion break region is co-planar with at least one of a top surface of one or more gate contacts and a top surface of one or more source/drain contacts.

2. The semiconductor device of claim 1,
wherein the top surface of the diffusion break region is co-planar with a top surface of the first gate contact and a top surface of the second gate contact.

3. The semiconductor device of claim 1, wherein the diffusion break region is disposed between the first gate contact and the second gate contact.

4. The semiconductor device of claim 1, wherein the first gate contact and second gate contact are cross-coupled with a first source/drain contact and a second source/drain contact, respectively.

5. The semiconductor device of claim 1, further comprising:
a first source/drain region;
a second source/drain region;
a first source/drain contact on the first source/drain region; and
a second source/drain contact on the second source/drain region;
wherein the top surface of the diffusion break region is co-planar with a top surface of the first source/drain contact and a top surface of the second source/drain contact.

6. The semiconductor device of claim 5, wherein the diffusion break region is disposed between the first source/drain contact and the second source/drain contact.

7. The semiconductor device of claim 6, wherein a first edge of the diffusion break region abuts an edge of the first source/drain contact and a second edge of the diffusion break region abuts an edge of the second source/drain contact.

8. The semiconductor device of claim 6, wherein the first source/drain contact corresponds to a supply voltage and the second source/drain contact corresponds to a bitline voltage.

9. The semiconductor device of claim 1, wherein a bottom surface of the diffusion break region is under at least one of a bottom surface of the one or more gate contacts and a bottom surface of the one or more source/drain contacts.

10. The semiconductor device of claim 1, wherein the diffusion break region comprises a double diffusion break region.

11. The semiconductor device of claim 1, wherein the one or more gate contacts and the one or more source/drain contacts comprise middle-of-line contacts.

12. A semiconductor device, comprising:
a first gate region;
a second gate region;
a first gate contact on the first gate region;
a second gate contact on the second gate region; and
a double diffusion break region between the first gate region and the second gate region, a first edge of the double diffusion break region abutting an edge of the first gate contact and a second edge of the double diffusion break region abutting an edge of the second gate contact;
wherein a top surface of the double diffusion break region is above a top surface of the first gate region and above a top surface of the second gate region.

13. The semiconductor device of claim 12,
wherein the top surface of the double diffusion break region is co-planar with a top surface of the first gate contact and a top surface of the second gate contact.

14. The semiconductor device of claim 12, wherein the double diffusion break region is disposed between the first gate contact and the second gate contact.

15. The semiconductor device of claim 12, wherein the first gate contact and second gate contact are cross-coupled with a first source/drain contact and a second source/drain contact, respectively.

16. The semiconductor device of claim 12, further comprising:

a first source/drain region;

a second source/drain region;

a first source/drain contact on the first source/drain region; and a second source/drain contact on the second source/drain region;

wherein the top surface of the double diffusion break region is co-planar with a top surface of the first source/drain contact and a top surface of the second source/drain contact.

17. The semiconductor device of claim 12, wherein a bottom surface of the double diffusion break region is under at least one of a bottom surface of one or more of the first and second gate contacts and a bottom surface of one or more source/drain contacts.

18. A semiconductor device, comprising:

a first gate contact on a first gate region;

a second gate contact on a second gate region;

a first source/drain contact;

a second source/drain contact; and a diffusion break region between the first gate contact and the second gate contact, and between the first source/drain contact and the second source/drain contact, a first edge of the diffusion break region abutting an edge of the first gate contact and a second edge of the diffusion break region abutting an edge of the second gate contact;

wherein a top surface of the diffusion break region is co-planar with at least one of top surfaces of the first and second gate contacts and top surfaces of the first and second source/drain contacts.

19. The semiconductor device of claim 18, wherein a third edge of the diffusion break region abuts an edge of the first source/drain contact and a fourth edge of the diffusion break region abuts an edge of the second source/drain contact.

20. The semiconductor device of claim 18 wherein a bottom surface of the diffusion break region is under at least one of a bottom surface of one or more of the first and second gate contacts and a bottom surface of one or more of the first and second source/drain contacts.

* * * * *